Sept. 24, 1968 L. A. HARWOOD 3,403,354
LINEAR FREQUENCY MODULATION SYSTEM INCLUDING AN OSCILLATING TRANSISTOR, AN INTERNAL CAPACITY OF WHICH IS VARIED IN ACCORDANCE WITH A MODULATING SIGNAL
Filed April 26, 1965
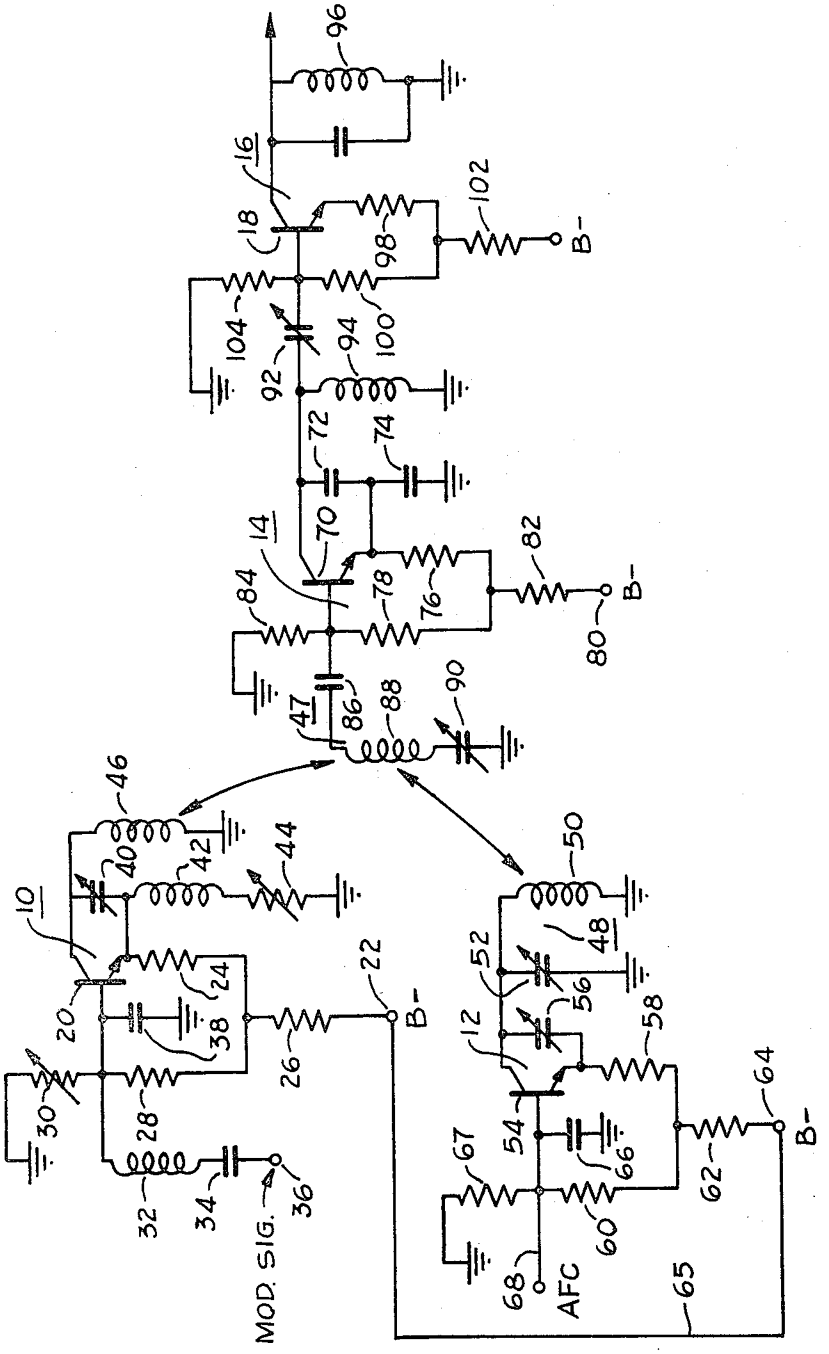
INVENTOR.
LEOPOLD A. HARWOOD
BY Edward J. Norton
ATTORNEY United States Patent Office 3,403,354

Patented Sept. 24, 1968

3,403,354

LINEAR FREQUENCY MODULATION SYSTEM INCLUDING AN OSCILLATING TRANSISTOR, AN INTERNAL CAPACITY OF WHICH IS VARIED IN ACCORDANCE WITH A MODULATING SIGNAL

Leopold A. Harwood, Somerville, N.J., assignor to Radio Corporation of America, a corporation of Delaware Filed Apr. 26, 1965, Ser. No. 450,805
12 Claims. (Cl. 332—19)

ABSTRACT OF THE DISCLOSURE

A linear frequency modulation system is provided utilizing a modulated oscillating transistor which needs no variable reactance element other than the internal capacity change between electrodes of the transistor. To avoid changes in frequency of the oscillator due to changes in temperature, or due to variations in the voltage supply, a second similar unmodulated oscillating transistor, which is subjected to the same temperature and which is supplied by the same voltage supply is provided. A beat frequency which is obtained by beating the waves provided by the two oscillating transistors therefor will not vary in frequency due to change in ambient temperature or in change of supply voltage and yet may be linearly frequency modulated.

This invention relates to linear frequency modulated oscillator systems, and more particularly to such systems including transistors.

To minimize distortion in the detection of a transmitted and received frequency modulated signal, it is advantageous to provide frequency modulation devices which exhibit a linear relationship between a voltage representing a modulation signal and the frequency of the frequency modulated waves. While the reactance of an oscillator external to the amplifying element thereof may be varied in accordance with a modulating voltage, such an oscillator requires the addition of signal variable reactance elements. Advantage may be taken of the change in capacity between the electrodes of the amplifying elements of an oscillator to provide linear frequency modulated oscillations without the necessity of external, signal variable reactance elements.

It is an object of this invention to provide an improved frequency modulated oscillator system including a transistor.

It is another object of this invention to provide a transistor oscillator system in which the application of a modulating signal to an electrode of the transistor comprising the amplifying element of the oscillator causes the oscillator to exhibit a linearly related change of frequency without the necessity of varying an external reactance of the oscillator.

It is still another object of the invention to provide an improved transistor oscillator having no signal variable reactance element other than the transistor.

In accordance with this invention, an oscillator is provided comprising a transistor having a collector, an emitter and a base, and including an inductive connection between the collector and the base and a feedback capacity between the collector and the emitter. The direct component of the operating voltage applied between the collector and the base of the transistor is kept constant to keep the internal capacity between the collector and the base constant. The signal modulation component which is applied to the base is varied over a relatively small range such as ±100 millivolts. The transistor is so connected that the resultant potential variation between the collector and base is of the same amplitude. The resultant internal capacity change of the transistor, however, does not vary the frequency of the oscillator significantly.

The base current is varied in accordance with the modulating signal whereby the emitter current flowing is similarly varied and the capacity between the emitter and the base is varied. The tuning of the oscillator, and therefore its output frequency is varied in a substantially linear manner in accordance with the modulating signal. Since the size of the feedback capacitor influences the linearity of the frequency modulation to a small extent, the feedback capacitor may be adjusted to improve or optimize this linearity. The oscillations provided by the frequency modulated oscillator can be beat or mixed with the oscillations provided by a second similar oscillator to which automatic frequency control currents can be applied. Since the two oscillators are similar and may be placed in similar surroundings, and since they may be energized from the same voltage source, their frequencies vary similarly with changes in applied voltage and with changes in temperature whereby the difference beat frequency is not affected by changes in these parameters.

The novel features of this invention both as to its organization and method of operation as well as additional objects and advantages thereof will be understood more readily from the following description when read in conjunction with the accompanying drawing in which the sole figure is a circuit diagram of one embodiment of a frequency modulated oscillator system constructed according to this invention.

Referring to the figure, the output signal of a frequency modulated oscillator 10 is beat with the frequency controlled wave of a similar oscillator 12 in a mixer stage 14 and the output of the mixer 14 is amplified in an amplifier 16. The amplified wave appearing at the collector of the amplifier transistor 18 may be further amplified or may be applied to an antenna or to another load (not shown).

The frequency modulated oscillator 10 comprises an NPN transistor 20 having its emitter connected to the negative terminal 22 of a source of supply voltage (not shown) through two resistors 24 and 26 in series. The junction of the two resistors 24 and 26 is connected through another resistor 28 to the base of the transistor 20. The base is also connected through a variable resistor 30 to ground and through a radio frequency choke coil 32 and a blocking capacitor 34 to a terminal 36 of a source of modulating signal voltages (not shown). A radio frequency by-pass capacitor 38 connects the base of the transistor 20 to ground. The emitter of the transistor 20 is also connected to the collector thereof through a variable feedback capacitor 40 and to ground through a radio frequency choke coil 42 and a variable resistor 44 in series. The output oscillations are taken from the primary winding 46 of a transformer 47, the winding 46 being connected between the collector of the transistor 20 and ground.

In the described oscillator 10, oscillations are produced by the feedback of energy from the collector to the emitter through the capacitor 40 and through the internal capacity between the several electrodes of the transistor 20. The frequency of these oscillations is determined by the inductance 46, the internal capacity between the collector and the base, and the internal capacity between the emitter and the base in series with the feedback capacitor 40. The internal capacity between the collector and the base varies inversely as the third root of the voltage applied therebetween. The direct voltage on the base of the transistor 20 with respect to ground is determined by the voltage divider action of the resistors 28 and 30, since the base current is very small in comparison with the current through the resistors 28 and 30 from the supply, and this voltage is also determined by the voltage drop across the resistor 26. The collector of the transistor 20 is grounded at the frequency of the modulating signal applied to the terminal 36 due to the low resistance of the connection of the collector to ground including the primary winding 46, whereby the modulating signal does not vary the voltage on the collector of the transistor 20. Since the modulating signal voltage applied to the base of the transistor 20 varies the voltage thereon only by a small amount (±100 millivolts), and since the described circuit is degenerative with respect to the modulating signal, the base to collector potential changes only by the amount of the modulating signal. Therefore, since there is substantially no voltage change between the base and the collector of the transistor 20 during the operation of the frequency modulated oscillator 10, the internal capacity of the transistor 20 between its base and collector exhibit substantially no change, whereby the frequency of the oscillations produced by the oscillator 10 are not changed due to any change in this internal capacity.

The average current flowing into the base of the transistor 20 is set at a desired value by the potentiometer comprising the resistors 28 and 30, and this current is varied momentarily by the modulating signal voltage applied at the terminal 36 which appears as a momentary change of current at the base of the transistor 20. The emitter degeneration provided by the resistors 24 and 26 (in parallel with the resistor 44) causes a linear relationship between the applied modulating signal voltage and the emitter current, since without emitter degeneration, the emitter current would vary non-linearly with the modulating signal and the resultant capacity change between the emitter and base would be a nonlinear function of the modulating voltage. Due to this linear variation in emitter current, the capacity between the emitter and base is varied linearly and the output frequency of the oscillator 10 varies linearly with the modulating voltage applied to the terminal 36.

While the magnitude of the feedback capacitor 40 has a small effect on the frequency modulation linearity, its adjustment is not critical and its value can be so chosen as to optimize the linearity of variation of the frequency of the oscillator as the control current applied to the base of the transistor 20 varies.

The oscillator 12, which is similar to the oscillator 10, provides a lower frequency than the oscillator 10. The oscillator 12 comprises a parallel tuned output circuit 48 including an inductor 50 and a capacitor 52 connected in parallel between the collector of the transistor 54 of the oscillator 12 and ground. The inductor 50 may be a second primary winding of the transformer 47. A variable feedback capacitor 56 is connected between the collector and the emitter of the transistor 54, and two resistors 58 and 60 are connected in series between the emitter and the base thereof. The junction of the two resistors 58 and 60 is connected to a negative terminal 64 of the source of operating potential (not shown). As shown by the connection 65, one source may be connected to both terminals 22 and 64. The base of the transistor 54 is also connected to ground through a by-pass capacitor 66 and a resistor 67 in parallel, and to a source of automatic frequency control current (not shown) by way of a lead 68. The frequency of the oscillator 12, which operates similarly to the oscillator 10, will be varied linearly with changes in the automatic frequency control current.

The waves provided by the oscillators 10 and 12 are beat in the mixer stage 14, the mixer stage 14 comprising a transistor 70 whose collector is connected to its emitter by way of the capacitor 72. The emitter is connected to ground by way of a further capacitor 74 and to the base by way of two resistors 76 and 78 in series. The junction of the resistors 76 and 78 is connected to a negative terminal 80 of a source of operating potential (not shown). The base of the transistor 70 is also connected to ground by a resistor 84, and also through the series combination of a blocking capacitor 86 and the secondary winding 88 of the transformer 47 and a variable tuning capacitor 90. Due to the mixing action of the mixer stage 14, a wave at a frequency which is the difference between the frequencies of the waves produced by the oscillators 10 and 12 appears at the collector of the mixer transistor 70. In the absence of the application of frequency modulation potential to the oscillator 10 and of automatic frequency control currents to the oscillator 12, the frequency of the difference wave is substantially unvaried due to any change in the supply voltage or in ambient temperature, since any variation in frequency of the two oscillators due to change in temperature or in operating potential is in the same direction and of substantially the same amount, since, as noted above, the same source is connected to the input power connections 22 and 64.

The output of the mixer 14 is fed to the base of the transistor 18 included in the amplifier 16 through a variable series coupling capacitor 92 and across an inductor 94 which is connected between the collector of the transistor 70 and ground. The amplifier 16 includes the transistor 18 whose collector is connected through a tuned circuit 96 tuned to the difference or beat frequency to ground. The emitter of the transistor 18 is connected to the base thereof through two resistors 98 and 100 in series and the junction of the resistors 98 and 100 is connected to the negative terminal of a source through a resistor 102. The base is connected to ground through a further resistor 104. The combination of the capacitors 72 and 74, the inductor 94 and the tuned circuit 96, eliminates mixer products other than the difference frequency modulated waves for which the circuit 96 is tuned.

The following list of elements and their values is given as illustrative of a practical modulation system.

Transistors 18, 20, 54 and 70—2N2857
Resistors 24, 26, 58, 62, 76, 82, 98 and 102—680 ohms
Resistor 30—Variable, maximum value of 5000 ohms
Resistor 44—Variable, maximum value of 1000 ohms
Resistors 28, 60, 78, 84, 100 and 104—6800 ohms
Resistor 67—15,000 ohms
Capacitor 34—10 microfarads
Capacitor 38—100 micromicrofarads
Capacitors 66 and 74—1000 micromicrofarads
Capacitor 86—470 micromicrofarads
Capacitor 72 and the capacitor of the tuned circuit 96—3 micromicrofarads
Capacitors 40, 52 and 56—Variable, 1–10 micromicrofarads
Capacitor 90—Variable, 5–18 micromicrofarads In the system using the above-listed components, the unmodulated frequency of the oscillator 10 can be 530 megacycles, and the unregulated frequency of the oscillator 12 can be 460 megacycles, the beat frequency can be variable over a frequency range of ±15 megacycles about the unmodulated frequency of the oscillator 10 at a sensitivity of 20 millivolts per megacycle of variations of output frequency, and the linearity of the frequency modulations is better than one-half of one percent over a range of ±3 megacycles about the unmodulated frequency of the oscillator 10.

Although only a single modulation system has been shown and described, variations are possible within the spirit of the invention. For example, while NPN transistors have been shown, PNP transistors may be used with appropriate changes in voltage polarity. Hence it should be understood that the foregoing description is to be considered as illustrative and not in a limiting sense.

What is claimed is:

1. A frequency modulated oscillator whose frequency varies linearly in accordance with variations of a control signal comprising:

a transistor having a collector, an emitter and a base, a connection having low resistance and including an inductor connected between said collector and one terminal of a source of supply potential, a degenerative resistive impedance connected between said emitter and another terminal of said source of supply potential, a feedback capacitor connected between said collector and said emitter, the frequency of said oscillator being determined by said inductor, the internal capacity between said collector and said base and the series combination of said feedback capacitor and the internal capacity between said emitter and said base, means to keep the voltage on said collector constant with respect to said base, whereby said internal capacity between said collector and said base is kept substantially constant, said means including said connection between said collector and said one source terminal and a potentiometer connected across the terminals of said source, said base being connected to a point on said potentiometer, and means for applying said control signal to said base to vary said emitter current proportionately to said control signal whereby the frequency of said oscillator varies as a linear function of the variations in said control signal.

2. A frequency modulated oscillator whose frequency varies linearly in accordance with variations of a control voltage comprising:

a transistor having a collector, an emitter and a base, a connection having low resistance and including an inductor connected between said collector and a point of reference potential, a degenerative resistive impedance connected between said emitter and a terminal of a source of supply potential, the other terminal of said source being connected to said point of reference potential, a feedback capacitor connected between said collector and said emitter, the frequency of said oscillator being determined by said inductor, the internal capacity between said collector and said base and the series combination of said feedback capacitor and the internal capacity between said emitter and said base, means to keep the voltage on said collector constant with respect to said base, whereby said internal capacity between said collector and said base is kept substantially constant, said means including said connection between said collector and said point of reference potential and a potentiometer connected across the terminals of said source, said base being connected to a point on said potentiometer, and means for applying said control voltage to said base to vary said emitter current proportionately to said control voltage whereby the frequency of said oscillator varies as a linear function of the variations in said control voltage.

3. A frequency modulated oscillator whose frequency varies linearly in accordance with variations of a control current comprising:

a transistor having a collector, an emitter and a base, a connection having low resistance and including an inductor connected between said collector and a point of reference potential, a degenerative resistive impedance connected between said emitter and a terminal of a source of supply potential, the other terminal of said source being connected to said point of reference potential, a feedback capacitor connected between said collector and said emitter, the frequency of said oscillator being determined by said inductor, the internal capacity between said collector and said base and the series combination of said feedback capacitor and the internal capacity between said emitter and said base, means to keep the voltage on said collector constant with respect to said base, whereby said internal capacity between said collector and said base is kept substantially constant, said means including said connection between said collector and said point of reference potential and a potentiometer connected across the terminals of said source, said base being connected to a point on said potentiometer, and means for applying said control current to said base to vary said emitter current proportionately to said control current whereby the frequency of said oscillator varies as a linear function of the variations in said control current, said feedback capacitor having a small effect on the linearity of the relation between the variation of said control current and the variations in the frequency of said oscillator, said feedback capacity being so chosen as to improve said linearity.

4. A frequency modulated oscillator whose frequency varies linearly in accordance with the variation of a control current comprising:

a transistor having a base, a collector and an emitter, and inductor connected between said collector and said base, a feedback capacitor connected between said collector and said emitter, means for keeping said collector at substantially a constant voltage with respect to said base whereby variation in the internal capacity of said transistor between said collector and base is minimized and variations in control current applied to said base vary the frequency of said oscillator in a linear manner, and means for applying a control current to said base.

5. A frequency modulated oscillator whose frequency varies linearly in accordance with the variation of a control current comprising:

a transistor having a base, a collector and an emitter, an inductor connected between said collector and said base, a feedback capacitor connected between said collector and said emitter, means for keeping said collector at substantially a constant voltage with respect to said base whereby variation in the internal capacity of said transistor between said collector and base is minimized and variations in control current applied to said base vary the frequency of said oscillator in a linear manner, the value of said feedback capacitor being so chosen as to improve the linearity of frequency modulation of said frequency modulated oscillator, and means for applying a control current to said base.

6. A frequency modulated oscillator whose frequency varies linearly in accordance with variations of a control current comprising:

a transistor having a collector, an emitter and a base, an inductor connected between said collector and said base, a feedback capacitor connected between said collector and said emitter, the frequency of said oscillator being determined by said inductor, the internal capacity between said collector and said base and the series combination of said feedback capacitor and the internal capacity between said emitter and said base, means to keep the voltage on said collector constant with respect to said base, whereby said internal capacity between said collector and said base is kept substantially constant, and means for applying said control current to said base whereby the frequency of said oscillator varies as a linear function of the variations in said control current.

7. A frequency modulated oscillator whose frequency varies linearly in accordance with variations of a control current comprising:

a transistor having a collector, an emitter and a base,
an inductor connected between said collector and said base,
a feedback capacitor connected between said collector and said emitter, the frequency of said oscillator being determined by said inductor, the internal capacity between said collector and said base and the series combination of said feedback capacitor and the internal capacity between said emitter and said base,
means to keep the voltage on said collector constant with respect to said base, whereby said internal capacity between said collector and said base is kept substantially constant, and
means for applying said control current to said base whereby the frequency of said oscillator varies as a linear function of the variations in said control current,
said feedback capacitor having a small effect on the linearity of the relation between the variation of said control current and the variations in the frequency of said oscillator, said feedback capacity being so chosen as to improve said linearity.

8. A frequency modulated oscillator whose frequency varies linearly in accordance with variations of a control current comprising:

a transistor having a collector, an emitter and a base,
an inductor connected between said collector and said base,
a feedback capacitor connected between said collector and said emitter, the frequency of said oscillator being determined by said inductor, the internal capacity between said collector and said base and the series combination of said feedback capacitor and the internal capacity between said emitter and said base,
means to keep the voltage on said collector constant with respect to said base, whereby said internal capacity between said collector and said base is kept substantially constant,
said means comprising a potentiometer connected across a source of potential, a connection between a point on said potentiometer and said base, and a connection for connecting a terminal of said source to said collector through said inductor, and
means for applying said control current to said base whereby the frequency of said oscillator varies as a linear function of the variations in said control current,
said feedback capacitor having a small effect on the linearity of the relation between the variation of said control current and the variations in the frequency of said oscillator, said feedback capacity being so chosen as to improve said linearity.

9. A linear frequency modulated oscillator system comprising:

a pair of oscillators whose frequencies may be varied linearly in accordance with the variation of a control current applied thereto, each oscillator comprising a transistor having a base, a collector and an emitter,
an inductor connected individually between the collector and the base of each transistor,
a feedback capacitor connected individually between the collector and the emitter of each transistor,
means for keeping the collector of each transistor at substantially a constant voltage with respect to the base thereof whereby variations in the internal capacities of said transistors between their respective collectors and bases is minimized and variations in control current applied to their repective bases vary the frequencies of said oscillators in a linear manner, means for applying the same operating potential to said two oscillators, whereby said oscillators change frequency due to change in operating potential in the same amount and direction,
means for applying a frequency modulation control current to the base of one of said frequency modulated oscillators, and
means to beat the output of said oscillators to obtain a modulated beat wave of difference frequency, said difference frequency being unchanged due to change in ambient temperature or change in operating potential.

10. A linear frequency modulated oscillator system comprising:

a pair of oscillators whose frequencies may be varied linearly in accordance with the variation of a control current applied thereto, each oscillator comprising a transistor having a base, a collector and an emitter,
an inductor connected individually between the collector and the base of each transistor,
a feedback capacitor connected individually between the collector and the emitter of each transistor,
means for keeping the collector of each transistor at substantially a constant voltage with respect to the base thereof whereby variations in the internal capacities of said transistors between their respective collectors and bases is minimized and variation in control current applied to their respective bases vary the frequencies of said oscillators in a linear manner,
means for applying the same operating potential to said two oscillators whereby the oscillators change frequency due to change in operating potential in the same amount and manner,
the value of a feedback capacitor of one of said oscillators being so chosen as to improve the linearity of frequency modulation of said one frequency modulated oscillator,
means for applying a frequency modulation control current to the base of said frequency modulated oscillator, and
means to beat the output of said oscillators to obtain a modulated beat wave of difference frequency, said difference frequency being unchanged due to change in ambient temperature or change in operating potential.

11. A frequency regulatable linearly frequency modulated oscillator system comprising:

a pair of oscillators whose frequencies vary linearly in accordance with the variation of a control current applied thereto, each oscillator comprising a transistor having a base, a collector and an emitter,
an inductor connected individually between the collector and the base of each transistor,
a feedback capacitor connected individually between the collector and the emitter of each transistor,
means for keeping the collector of each transistor at substantially a constant voltage with respect to the base thereof, whereby variations in the internal capacities of said transistors between their respective collectors and bases is minimized and variations in control current applied to their respective bases vary the frequencies of said oscillators in a linear manner,
means for applying the same operating potential to said two oscillators, whereby the oscillators change frequency due to change in operating potential in the same amount and manner,
the value of said feedback capacitors being so chosen as to improve the linearity of frequency variation of said variable frequency oscillators with applied control current,
means for applying a frequency modulation control current to one of said bases and a frequency regulation current to the other of said bases, and means to beat the output of said oscillators to obtain a modulated and regulated beat wave of difference frequency, said difference frequency being unchanged due to change in ambient temperature or change in operating potential.

12. A frequency regulatable linearly frequency modulated oscillator system comprising:

a pair of oscillators whose frequencies vary linearly in accordance with the variation of a control current applied thereto, each oscillator comprising a transistor having a base, a collector and an emitter, an inductor connected individually between the collector and the base of each transistor, a feedback capacitor connected individually between the collector and the emitter of each transistor, means for keeping the collector of each transistor at substantially a constant voltage with respect to the base thereof whereby variations in the internal capacities of said transistors between their respective collectors and bases is minimized and variations in control current applied to their respective bases vary the frequencies of said oscillators in a linear manner, each of said means comprising a potentiometer that is connectable across a source of potential and a connection from each base to a respective potentiometer, as well as a connection of a terminal of said source to said collectors, to thereby apply the same operating potential to said two oscillators, whereby the oscillators change frequency due to change in operating potential in the same amount and manner, the value of said feedback capacitor being so chosen as to improve the linearity of frequency variation of said variable frequency oscillator with application of control current thereto, means for applying a frequency modulation control current to one of said bases and a frequency regulation current to the other of said bases, and means to beat the output of said oscillators to obtain a modulated and regulated beat wave of difference frequency, said difference frequency being unchanged due to change in ambient temperature or change in operating potential.

References Cited

UNITED STATES PATENTS

| | | | |
|---|---|---|---|
| 2,823,312 | 2/1958 | Keonjian | 331—117 |
| 2,870,421 | 1/1959 | Goodrich | 332—16 X |
| 3,192,487 | 6/1965 | Noordanus et al. | 331—109 X |
| 3,307,119 | 2/1967 | Holzwarth et al. | 332—19 X |

OTHER REFERENCES

Keonjian, "Stable Transistor Oscillator," Electrical Engineering, pp. 672–674, August 1955.

ALFRED L. BRODY, *Primary Examiner.*